(12) United States Patent
Iwanari

(10) Patent No.: US 6,865,101 B2
(45) Date of Patent: Mar. 8, 2005

(54) MEMORY SYSTEM AND SEMICONDUCTOR INTEGRATED CIRCUIT IN WHICH OPERATION TIMINGS CAN BE SET EXTERNALLY

(75) Inventor: Shunichi Iwanari, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 36 days.

(21) Appl. No.: 10/223,316

(22) Filed: Aug. 20, 2002

(65) Prior Publication Data

US 2003/0043538 A1 Mar. 6, 2003

(30) Foreign Application Priority Data

Aug. 23, 2001 (JP) ........................................ 2001-252523

(51) Int. Cl.[7] .............................................. G11C 11/22
(52) U.S. Cl. ....................... 365/145; 365/149; 365/154; 365/233
(58) Field of Search ................................ 365/145, 149, 365/154, 233

(56) References Cited

U.S. PATENT DOCUMENTS

| | | | | |
|---|---|---|---|---|
| 5,657,287 A | * | 8/1997 | McLaury et al. | 365/230.01 |
| 5,680,363 A | * | 10/1997 | Dosaka et al. | 365/230.03 |
| 5,699,314 A | * | 12/1997 | Hush et al. | 365/230.03 |
| 6,016,280 A | * | 1/2000 | Maesako et al. | 365/226 |
| 6,272,037 B1 | | 8/2001 | Miyamoto | |

FOREIGN PATENT DOCUMENTS

| | | |
|---|---|---|
| JP | 3-5996 | 1/1991 |
| JP | 3-113889 | 5/1991 |
| JP | 6-84384 | 3/1994 |
| JP | 6-131879 | 5/1994 |
| JP | 9-180466 | 7/1997 |
| JP | 10-162592 | 6/1998 |
| JP | 2000-057780 | 2/2000 |
| JP | 2001-210073 | 8/2001 |

* cited by examiner

Primary Examiner—Hoai Ho
(74) Attorney, Agent, or Firm—McDermott Will & Emery LLP

(57) ABSTRACT

A ferroelectric memory provided in a memory system stores in advance set data for data write time to memory cells. The set data include two types of data that differ between in a power-on state and in a power-off instruction time. When power is turned on, the set data that are stored in the ferroelectric memory are stored and retained in a latch circuit by a control circuit. Based on the set data retained in the latch circuit, data writing is performed in the ferroelectric memory respectively in the power-on state and in the power-off instruction time. Thus, operations of the ferroelectric memory can be controlled with desired operation timings according to operating conditions for each memory system. Excessive stress application to the ferroelectric memory during the power-on state is prevented and endurance deterioration is suppressed, while data retention characteristics after power-off are improved.

5 Claims, 9 Drawing Sheets

MEMORY SYSTEM AND SEMICONDUCTOR INTEGRATED CIRCUIT IN WHICH OPERATION TIMINGS CAN BE SET EXTERNALLY

BACKGROUND OF THE INVENTION

The present invention relates to memory systems and semiconductor integrated circuits and more particularly to memory systems and semiconductor integrated circuits in which the operation timings can be set externally and which they can be operated at suitable timings that systems require.

Generally, semiconductor memories in a system set are incorporated on a common board together with other semiconductor elements, such as D-A converters, A-D converters, CPUs, and control logic circuits. Likewise, in merged memory-logic devices (embedded memory devices), semiconductor memories are incorporated on a common chip together with microprocessors and control logic circuits. In the former case, the semiconductor memories are formed in a package or in the form of bare chips, whereas in the latter case, they are formed using a common process for forming other devices that are incorporated on the chip.

In bare-chip-form semiconductor memories incorporated in system set products that are not packaged products, and in merged memory-logic products fabricated with control logic circuits using the same process, it is often the case that the control logic circuit also serves the function of a circuit for generating control signals to the semiconductor memories, in order to reduce the area occupied by the circuit. In that case, the control logic circuit having the dual function supplies memory control signals to semiconductor memories at predetermined timings.

When constructing semiconductor memories on a common board or a common system with microprocessors or the like, it is necessary to select and incorporate devices that can operate at an operating speed that is required for the memory in the set as a whole.

If a plurality of semiconductor memories are incorporated in a given system, however, the control logic circuit having the dual function supplies memory control signals to two or more semiconductor memories at the same timings, and therefore, these semiconductor memories operate with the same timings and consume electric current with the same timings. Consequently, the system suffers from the drawback of large peak currents.

In addition, when power supply voltages and memory ambient temperatures of semiconductor memories varies, operation timings of the semiconductor memories change according to the variations, even though memory control signals are set to be output so that semiconductor memories in the system operate with suitable predetermined timings. Thus, the memories suffer from the drawback that timing deviations occur and the memories do not operate with the suitable predetermined timings.

Such problems of the increase in peak current and the variation in operation timings arise in merged memory-logic devices as well as in system sets.

As described above, semiconductor memories and systems incorporating these have a drawback that operation timings are fixed irrespective of operating conditions, such as simultaneous operation with other semiconductor memories, power supply voltages, and ambient temperatures. Similar drawbacks also exist in ferroelectric memories, which are non-volatile memories. In the following, drawbacks in ferroelectric memories (FeRAMs) are discussed.

First, deterioration of ferroelectric memory is discussed. When data write and rewrite are repeated in a ferroelectric memory, that is, when polarization reversals are repeated in a ferroelectric, the ferroelectric suffers a ferroelectric fatigue deterioration phenomena, in which, for example, the repetition of polarization reversal causes remanent polarization to decrease, Because the ferroelectric memory is a destructive readout memory, the ferroelectric fatigue deterioration phenomena occur as the ferroelectric undergoes polarization reversals both during write operation and during read operation, resulting in reliability problems, such as a decrease in data retention duration, readout incapability, and rewrite incapability. In the endurance deterioration, which is one of the ferroelectric fatigue deterioration phenomena, the degree of deterioration depends on the voltage applied to memory cells during data writing and the time during which the voltage is applied, so the deterioration is promoted as the voltage is higher and the time during which the voltage is applied is longer whereas the deterioration phenomenon is suppressed as the write voltage is lower and the time during which the voltage is applied is shorter. However, in such write operation, because the operation timings are predetermined and the data write time is fixed, it is often the case that stress is excessively applied to memory cells and thus ferroelectric fatigue deterioration phenomena are promoted, which is undesirable in terms of reliability.

Concerning prior art ferroelectric memories, Japanese Unexamined Patent Publication No. 3-113889, for example, discloses a technique of suppressing the endurance deterioration by reducing the voltage applied to the memory cells during read operations. In addition, Japanese Unexamined Patent Publication No. 3-5996 proposes a technique of operating a ferroelectric memory as a DRAM (volatile memory) during normal data-storing operations by switching the voltage applied to the memory cells during read operations between a high voltage and a low voltage. These conventional techniques, however, have such drawbacks as follows. First, an increase in layout area is caused because multiple power supply voltages need to be adopted in the semiconductor memory. Second, accuracy of applied voltages to memory cells degrades due to variation in transistor performance, and voltage reduction effect with respect to endurance deterioration vary between production lots. Third, readout defects easily occur due to shortage of the amount of readout charges.

SUMMARY OF THE INVENTION

It is an object to the present invention to configure operation timings of a semiconductor memory to be variable according to the operating conditions in a system set or a merged memory-logic device that incorporates the semiconductor memory.

In order to accomplish the foregoing and other objects, according to the present invention, various kinds of operation timings of a semiconductor memory are stored beforehand, then one of the operation timings is selected according to operating conditions, and operations of the semiconductor memory are controlled by the selected operation timing.

In accordance with one aspect, a memory system according to the present invention comprises: a non-volatile memory made of a plurality of circuit blocks operated by inputting a first signal; another memory made of a plurality of circuit blocks operated by inputting a second signal; a data latch circuit retaining output timings and cycles of the first signal and output timings and cycles of the second signal; and a timing generating circuit outputting the first signal to the non-volatile memory and outputting the second signal to the other memory according to the output timings and the cycles retained in the data latch circuit.

In the above-described memory system, the non-volatile memory may store the output timings and the cycles of the first signal and output timing and cycle of the second signal beforehand and may comprises another timing generating circuit; and the other timing generating circuit may transfer the output timings and the cycles of the first signal and the output timings and the cycles of the second signal stored in the non-volatile memory to the data latch circuit when power is turned on.

In accordance with another aspect, the present invention provides a memory system comprising: a ferroelectric memory having a cell driving block and a data amplifying block, the cell driving block applying voltage to a data retention element and the data amplifying block amplifying readout data from the data retention element; a data latch circuit retaining output timings and pulse widths of control signals respectively controlling the cell driving block and the data amplifying block; and a timing generating circuit respectively outputting the control signals to the cell driving block and to the data amplifying block according to the output timings and the pulse widths of the control signals retained in the data latch circuit; wherein: the pulse widths of the control signals retained in the data latch circuit are set so that the pulse widths are shorter in a power-on state during which a power supply potential is supplied to the ferroelectric memory, to the data latch circuit, and to the timing generating circuit, whereas they are longer in a power-off instruction time that is from the time when the cut-off of the power supply potential has been instructed until the supply is cut off; and after the cell driving block and the data amplifying block of the ferroelectric memory have been started to operate with the output timings of the control signals, operating periods of the cell driving block and the data amplifying block are set to be longer in the power-off instruction time than in the power-on state.

In the above-described memory system, the ferroelectric memory may carry out a data read operation and a data rewrite operation for a greater number of data retention elements within a single operation in the power-off instruction time than in the power-on state.

In accordance with further another aspect, the present invention provides a memory system comprising: a ferroelectric memory having a cell driving block and a data amplifying block, the cell driving block applying voltage to a data retention element and the data amplifying block amplifying readout data from the data retention element; a data latch circuit retaining output timings and pulse widths of control signals respectively controlling the cell driving block and the data amplifying block; and a timing generating circuit respectively outputting the control signals to the cell driving block and to the data amplifying block according to the output timings and the pulse widths of the control signals retained in the data latch circuit; wherein: the pulse widths of the control signals retained in the data latch circuit are set so that the pulse widths are shorter in a power-on state during which a power supply potential is supplied to the ferroelectric memory, to the data latch circuit, and to the timing generating circuit, whereas they are longer in a power-off instruction time that is from the time when the cut-off of the power supply potential has been instructed until the supply is cut off; and after the cell driving block and the data amplifying block of the ferroelectric memory have been started to operate with the output timings of the control signals, operating periods of the cell driving block and the data amplifying block are set to be longer in the power-off instruction time than in the power-on state.

In the above-described memory system, the pulse widths of the control signals may be set to be longer when the temperature is low than when the temperature is high.

In accordance with yet another aspect, the present invention provides a memory system comprising: a ferroelectric memory having a cell driving block and a data amplifying block, the cell driving block applying voltage to a data retention element and the data amplifying block amplifying readout data from the data retention element; a data latch circuit retaining output timings and pulse widths of control signals respectively controlling the cell driving block and the data amplifying block; a timing generating circuit respectively outputting the control signals to the cell driving block and to the data amplifying block according to the output timings and the pulse widths of the control signals retained in the data latch circuit; and a power supply potential-detecting circuit detecting a power supply potential supplied to the ferroelectric memory and outputting a selecting signal corresponding to the detected power supply potential to the data latch circuit; wherein: the data latch circuit retains, as the output timings and the pulse widths of the control signals, a plurality of different output timings and a plurality of different pulse widths that correspond to power supply potentials, and selects an output timing or a pulse width corresponding to the selecting signal from the power supply potential-detecting circuit; and at least one of operation timings or operating periods of the cell driving block and the data amplifying block of the ferroelectric memory is varied according to the power supply potential supplied to the ferroelectric memory.

In the above-described memory system, the pulse widths of the control signals may be set longer when the power supply potential is low than when the power supply potential is high.

In accordance with still another aspect, the present invention provides a memory system comprising: a ferroelectric memory; and a power supply potential-supplying circuit receiving or being cut off from the supply of a power supply potential from a power supply in response to an external signal, the power supply potential-supplying circuit supplying a second power supply potential to the ferroelectric memory via a power supply line; wherein the power supply potential-supplying circuit sets the second power supply potential to be higher in a power-off instruction time that is from the time when the cut-off of the power supply potential from the power supply has been instructed until the supply is cut off than in a power-on state during which the power supply potential is supplied from the power supply.

In accordance with further another aspect, the present invention provides a memory system comprising: a ferroelectric memory having a cell driving block and a data amplifying block, the cell driving block applying voltage to a data retention element and the data amplifying block amplifying readout data from the data retention element; a data latch circuit retaining output timings and pulse widths of control signals respectively controlling the cell driving block and the data amplifying block; a timing generating circuit respectively outputting the control signals to the cell driving block and to the data amplifying block according to the output timings and the pulse widths of the control signals retained in the data latch circuit; a temperature detecting circuit detecting an ambient temperature and outputting a selecting signal corresponding to the detected temperature to the data latch circuit; a power supply potential-detecting circuit detecting a power supply potential supplied to the ferroelectric memory and outputting a selecting signal corresponding to the detected power supply potential to the data latch circuit; and a power supply potential-supplying circuit receiving or being cut off from the supply of a power supply potential from a power supply in response to an external signal, the power supply potential-supplying circuit supplying a second power supply potential to the ferroelectric memory via a power supply line; wherein: the data latch circuit retains, as the output timings and the pulse widths of the control signals, a plurality of different output timings and a plurality of different pulse widths that correspond to temperatures and power supply potentials, and selects an output timing or a pulse width corresponding to the selecting signals from the temperature detecting circuit and the power supply potential-detecting circuit; at least one of operation timings or operating periods of the cell driving block and the data amplifying block of the ferroelectric memory is varied according to the power supply potential supplied to the ferroelectric memory or the ambient temperature; and the power supply potential-supplying circuit sets the second power supply potential to be higher in a power-off instruction time that is from the time when the cut-off of the power supply potential from the power supply has been instructed until the supply is cut off than in a power-on state during which the power supply potential is supplied from the power supply.

The present invention further provides a semiconductor integrated circuit in which one of the above-described memory systems as described above is incorporated on a single chip.

With the above-described configurations, the present invention achieves reduction in peak current in a system as a whole because such setting is possible that the output timing and the cycle of the first signal output to the non-volatile memory and the output timing and the cycle of the second signal output to another memory are different, and accordingly, the timings of current consumption in the non-volatile memory and in the other memory can be shifted from one another.

In particular, according to the present invention, the timing generating circuit that performs timing control necessary for the non-volatile memory to operate is incorporated in the non-volatile memory itself, and therefore, even if signal racing occurs between the input signals fed from the memory system to the non-volatile memory, such signal racing can be effectively prevented. Moreover, the next time the power is turned on, the FeRAM itself can read out required data using an internal control circuit, and consequently, non-volatile memories for retaining data after power-off can be eliminated.

Furthermore, according to the present invention, data write time to the ferroelectric memory can be freely set from a device external of the memory by varying pulse widths of the control signals. Particularly in the power-off instruction time, in order to sufficiently perform data writing to the ferroelectric memory, voltage application to the data retention element is set to be carried out for a longer time than in a power-on state, and therefore, data retention characteristics after power-off can be improved.

Further according to the present invention, in the power-off instruction time, more data retention elements are subjected to a rewrite operation (refresh operation) than in the power-on state, and therefore, data write in the power-off instruction time can be performed within a short time.

In addition, according to the present invention, data write time to the ferroelectric memory can be changed according the temperature of the memory system surrounding the ferroelectric memory so that, when the temperature is low, the pulse widths of the control signals given to the cell driving block and to the data amplifying block are set to be longer than those when the temperature is high. Therefore, data retention characteristics are improved since excessive stress to the ferroelectric memory can be prevented and voltage application time can be optimized.

Moreover, according to the present invention, when the power supply potential supplied to the ferroelectric memory decreases because of the variation in power supply potential caused by device operations in the system or the variation in power supply potential resulting from the power source, pulse widths of the control signals given to the cell driving block and to the data amplifying block in the ferroelectric memory are set to be longer than those when the power supply potential is high. Therefore, data retention characteristics are improved since data write time to the ferroelectric memory is optimized and data writing (causing polarization in data retention elements in the ferroelectric memory) is sufficiently performed.

Still further, according to the present invention, the power supply potential supplied to the ferroelectric memory is shifted higher in the power-off instruction time than in the power-on state. Therefore, faster data rewrite operations can be achieved in the power-off instruction time, and data retention characteristics can be improved since data writing to the ferroelectric memory is sufficiently carried out.

DETAILED DESCRIPTION OF THE INVENTION

Preferred embodiments of the present invention are detailed below with reference to the attached drawings.

Embodiment 1

Figure 1:
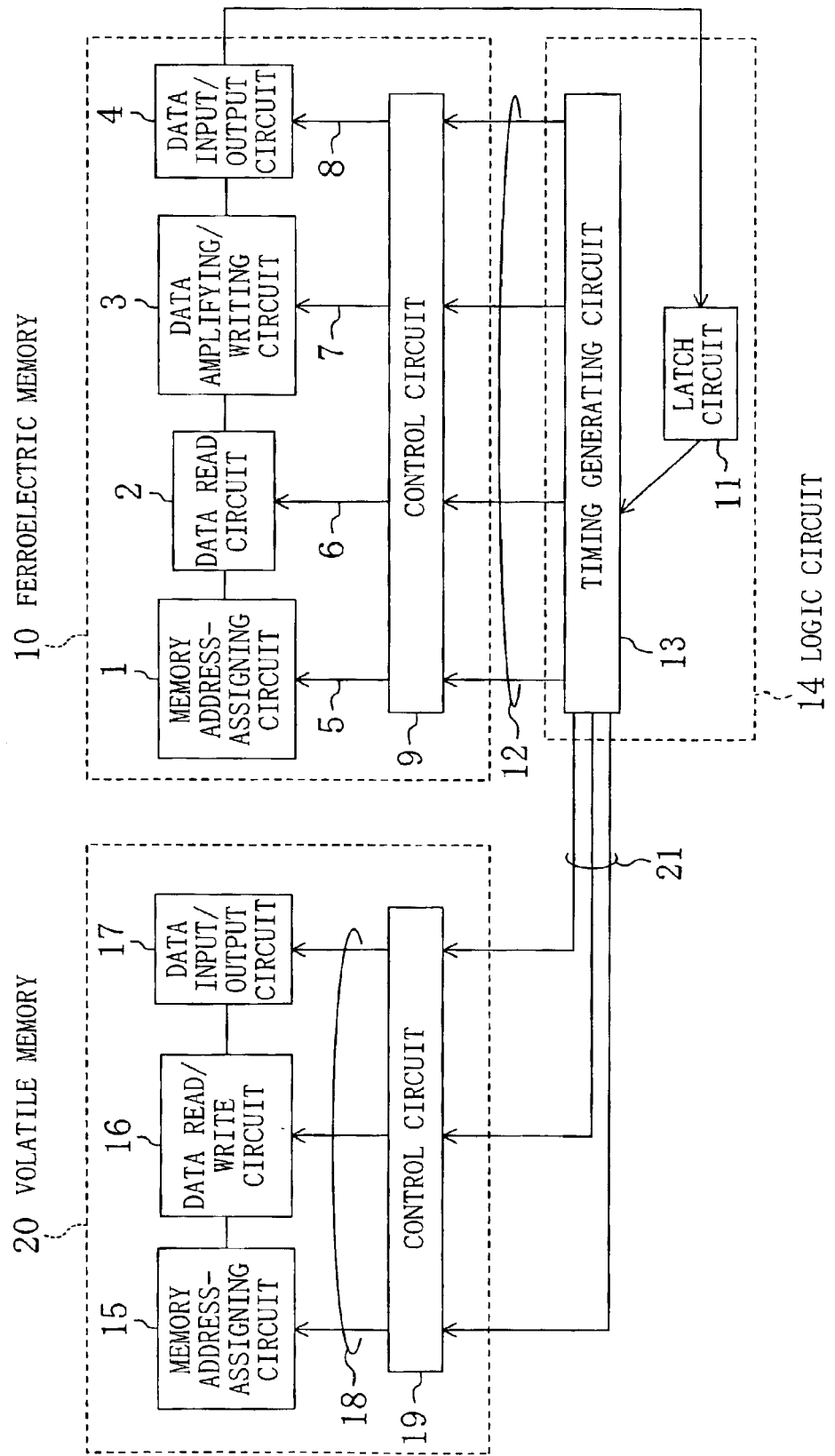
FIG. 1 shows the general configuration of a memory system according to Embodiment 1 of the present invention.

FIG. 1 schematically shows the configuration of a memory system in accordance with Embodiment 1 of the present invention. The memory system shown in the figure is a chipset in which a plurality of chips are put together, or a system LSI (semiconductor integrated circuit) which is incorporated in a single chip, and is made up of a ferroelectric memory 10, which is a non-volatile memory, a logic circuit 14, and another volatile memory 20 provided separately from the memory 10, such as an SRAM. The separately provided memory 20 is not limited to a volatile memory but may be a non-volatile memory.

The ferroelectric memory 10 has a memory address-assigning circuit 1, a data read circuit (cell driving block) 2, a data amplifying/writing circuit (data amplifying block) 3, a data input/output circuit 4, and a control circuit 9 that outputs control signals 5, 6, 7, and 8 respectively to these circuits 1 to 4. The memory address-assigning circuit 1 carries out, for example, operations up to word line selection according to external input addresses, and the data read circuit 2 carries out voltage application (driving of cell plate lines) to memory cells (data retention elements) in order to read out data from ferroelectric memory cells. The data amplifying/writing circuit 3 amplifies the very small electric charge that is read out from memory cells by the operation of the data read circuit 2 and transfers it to the data input/output circuit 4. The data input/output circuit 4 outputs the amplified data and takes in externally-supplied input data.

The control circuit (another timing generating circuit) 9 has a function of detecting and controlling the operation sequence of the above-described circuits (hereafter referred to as "circuit blocks") 1 to 4. When control signals 12 from a timing generating circuit 13, which will be detailed later, are not used, such as when power is turned on, the control circuit 9 also serves a function of controlling fundamental operations of the circuit blocks 1 to 4 that are necessary for the normal operation of the ferroelectric memory 10.

The volatile memory 20 has a memory address-assigning circuit 15, a data read/write circuit 16, a data input/output circuit 17, and a control circuit 19 that outputs control signals 18 to these circuit blocks 15 to 17.

In addition, the logic circuit 14 has a latch circuit 11 and a timing generating circuit 13 that generates an input signal (control signal) 12 supplied to the control circuit 9 of the ferroelectric memory 10 and a control signal 21 supplied to the control circuit 19 of the volatile memory 20. During the time when the power is on, the latch circuit (data latch circuit) 11 retains the data that has been read out from the ferroelectric memory 10 when power has been turned on. Based on the data retained in the latch circuit 11, the timing generating circuit 13 changes output timings and cycles of the control signal (first signal) 12 supplied to the ferroelectric memory 10 and of the control signal (second signal) 21 supplied to the volatile memory 20 according to operating conditions, to change operation timings and operation cycles of the ferroelectric memory 10 and the volatile memory 20.

Figure 2:
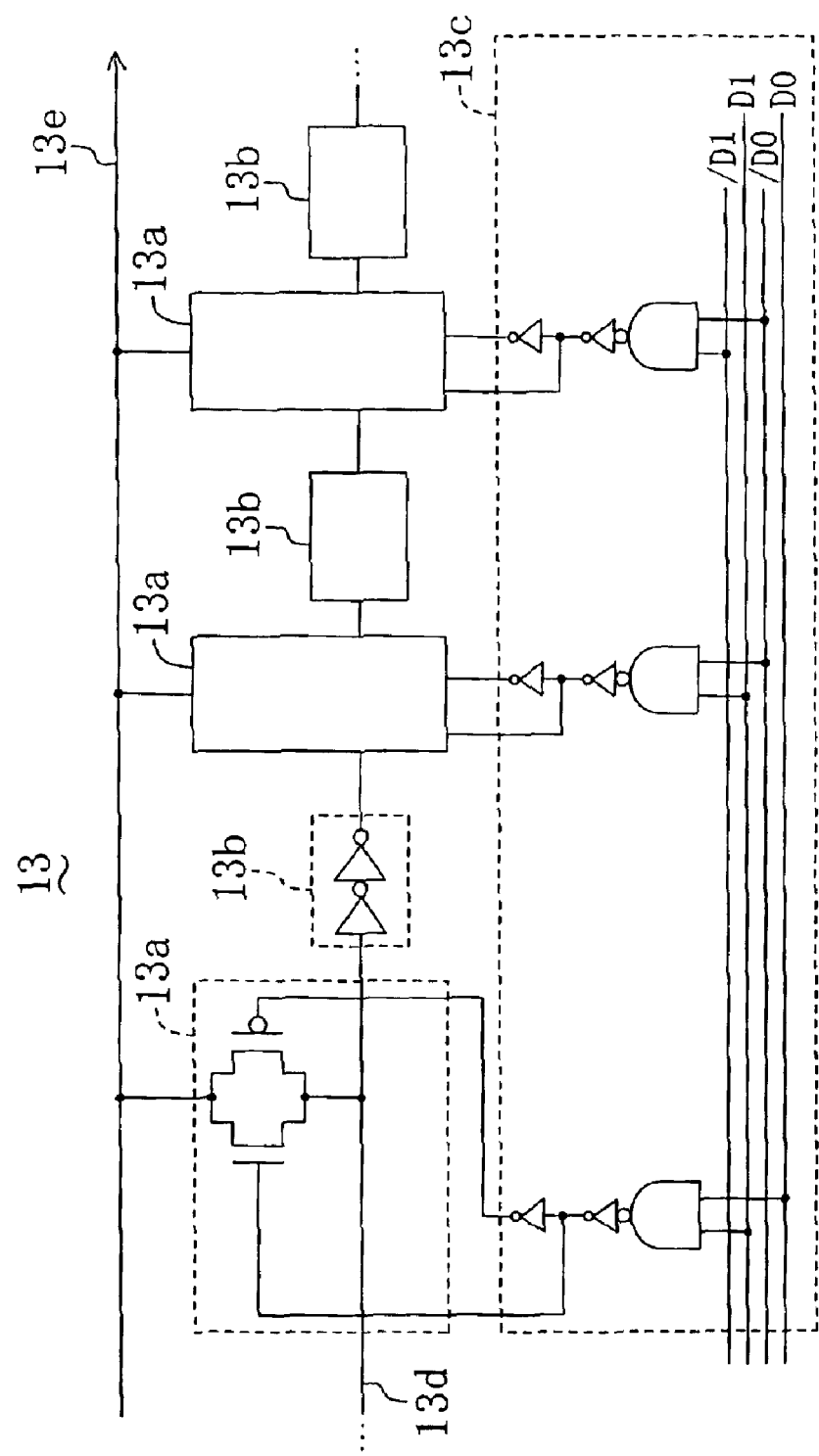
FIG. 2 shows the internal configuration of a timing generating circuit provided in the memory system.

The internal configuration of the timing generating circuit 13 of the logic circuit 14 is shown in FIG. 2. This figure shows, as an example, only the portion of the timing generating circuit 13 that is concerned with the ferroelectric memory 10, and omits the portion that is concerned with the volatile memory 20, as the configurations of these portions are the same. In the figure, reference numeral 13a denotes selector switches and reference numeral 13b delay circuits, and each of the selector switches 13a is provided between two delay circuits 13b. In addition, a code circuit 13c that controls a plurality of selector switches 13a (three switches in the case of the figure) is arranged in the timing generating circuit 13. The code circuit 13c controls the plurality of selector switches 13a according to timing data D0 and D1 and inverted data /D0 and /D1, which are inverted data of D0 and D1, that are received from the latch circuit 11. For example, during a power-on state in which the data D0 and D1 are (1, 1), an input path 13d of the control signal 12 is connected to an output path 13e only through the selector switch 13a that is positioned on the left side of the figure. On the other hand, at power-off instruction time in which the data D0 and D1 are (0, 0), the input path 13d is connected to the output path 13e by the selector switch 13a that is positioned on the right side of the figure so that the control signal 12 is delayed through two delay circuits 13b and is then output.

Next, an operation of the memory system having the above-described configuration is detailed below. Here, a specific example of the control signal 12 is described with reference to FIG. 3. The following describes a case in which the logic circuit 14 controls the internal operation of the ferroelectric memory 10 using signals that are compatible with the volatile memory (SRAM) 20.

Figure 3:
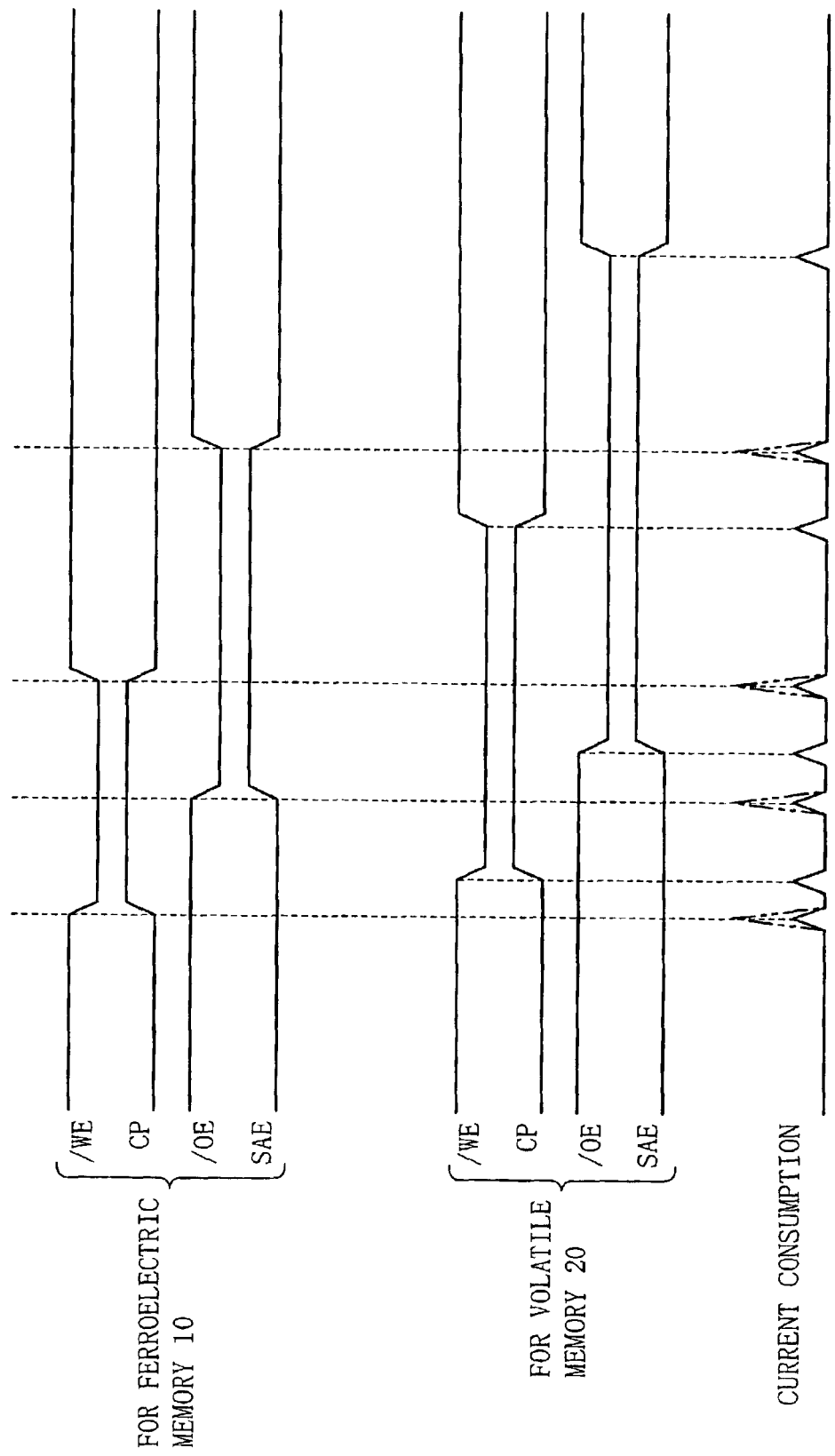
FIG. 3 illustrates operation timings of a ferroelectric memory and a volatile memory comprised in the memory system.

In FIG. 3, /WE denotes a signal for identifying a read operation and a write operation, CP denotes a signal for starting data-reading from memory cells, /OE denotes a signal for controlling the start and the stop of data output, and SAE denotes a signal for controlling the start and the stop of amplifying operation for the readout data. The figure is an explanatory diagram showing the case when operation timings are varied between the ferroelectric memory 10 and the volatile memory 20. Specifically, the rise and fall timings and the cycles of the signal /WE, the signal CP, the signal /OE, and the signal SAE are not made the same between the ferroelectric memory 10 and the volatile memory 10, but they are set to have different timings and cycles. The rise and fall timings of these four types of signals /WE, CP, /OE, and SAE for each of the memory 10 and the memory 20 are stored beforehand in the ferroelectric memory 10, are read out with the control circuit 9 from the ferroelectric memory 10 when power is turned on, and are transferred to the latch circuit 11 to be stored therein.

Thus, in the present embodiment, as shown in FIG. 3, the peak values of the current consumption of the ferroelectric memory 10 and the volatile memory 20 are distributed over time as indicated by the solid line in the figure, and the current consumption does not converge as in the case indicated by the dash-dotted line in the figure, in which the volatile memory 20 operates at the same timings as the ferroelectric memory 10. Therefore, the peak current value of the system as a whole can be suppressed to a small value.

The timing data of the timing control signals /WE, CP, /OE, and SAE for the ferroelectric memory 10 and the volatile memory 20 are stored and set in the ferroelectric memory 10 for each system. These timing data can be rewritten as needed since they are stored in the ferroelectric memory 10, so peak current can be suppressed on a system-by-system basis.

The foregoing discussion concerns only with the read operation, but the write operation may be handled in a similar manner. Therefore, according to the present embodiment, the peak current of the system as a whole can be suppressed to low levels both during the read operation and during the write operation.

Next, the operation of the memory system according to the present embodiment is described for the period from the time when power is turned on, during which power is on, and up to the power-off instruction time.

When power is turned on, under the control of the control circuit 9, the address-assigning circuit 1 selects a specific address, and operation timing data stored in the corresponding memory cells are read out, amplified, and then transferred from the data input/output circuit 4 to the latch circuit 11, in which they are stored and retained therein. These operation timing data are the operation timing data of the ferroelectric memory 10 for the following two periods: a period from the time when power-on has been completed until a power-off instruction is received from the outside (power-on state), and a period from the time when the power-off instruction has been received from the outside until the power supply is actually cut off (power-off instruction time).

Figure 4:
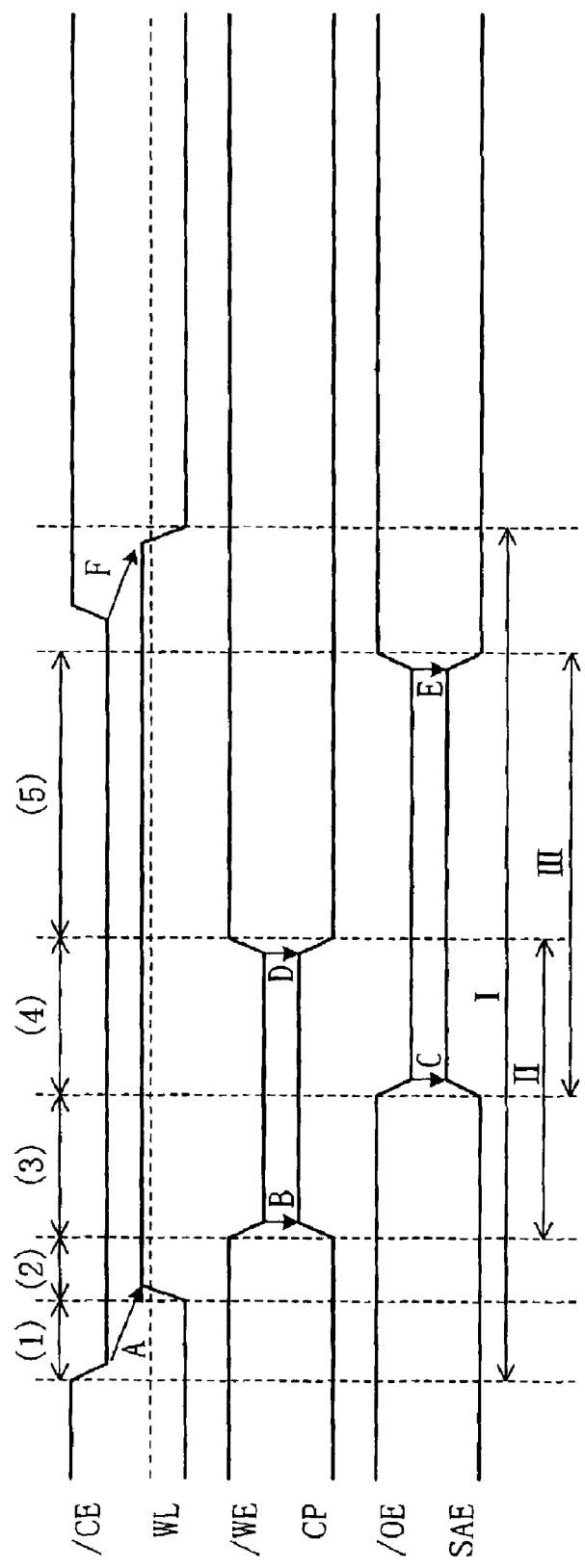
FIG. 4 illustrates data read operation timings of the ferroelectric memory in a power-on state.

In the power-on state, the timing generating circuit 13 of the logic circuit 14 outputs the control signal 12 with an operation timing and a pulse width that correspond to the operation timing data for power-on state that is stored in the latch circuit 11. In the following, a specific example of the control signal 12 is described with reference to FIG. 4. In FIG. 4, /CE denotes a signal for controlling the start and the stop of the operation, WL denotes a word line-selecting signal, /WE denotes a signal for identifying a read operation and a write operation, CP denotes a signal for starting a data-reading from memory cells, /OE denotes a signal for controlling the start and the stop of data output, and SAE denotes a signal for controlling the start and the stop of the amplifying operation for the readout data.

Referring to FIG. 4, at the time indicated by reference character A, an address is taken in with the fall of the control signal /CE of the logic circuit 14, and the operation up to the selection of a word line is carried out. Subsequently, at the time indicated by reference character B, the signal CP rises with the fall of the signal /WE of the logic circuit 14, and a data read operation from memory cells starts. Then, at the time indicated by reference character C, the signal SAE starts up with the fall of the signal /OE of the logic circuit 14, and a sense amplifier starts a read data-amplifying operation. In the ferroelectric memory 10, a start period I, a read period II, and a write period III, as shown in the figure, can be defined using the three signals /CE, /WE, /OE. As shown in the figure, the total of a period (4) from reference character C to reference character D and a period (5) from reference character D to reference character E, that is, a period represented as (4)+(5), corresponds to a data write period. Thus, data write periods can be freely set by controlling a period from the fall of the signal /OE until the rise of the signal /WE and a period from the rise of the signal /WE until the rise of the signal /OE. For this reason, in the present embodiment, timing data for the signal /WE and the signal /OE are different between the power-on state and the power-off instruction time. More details are given below.

Figure 5:
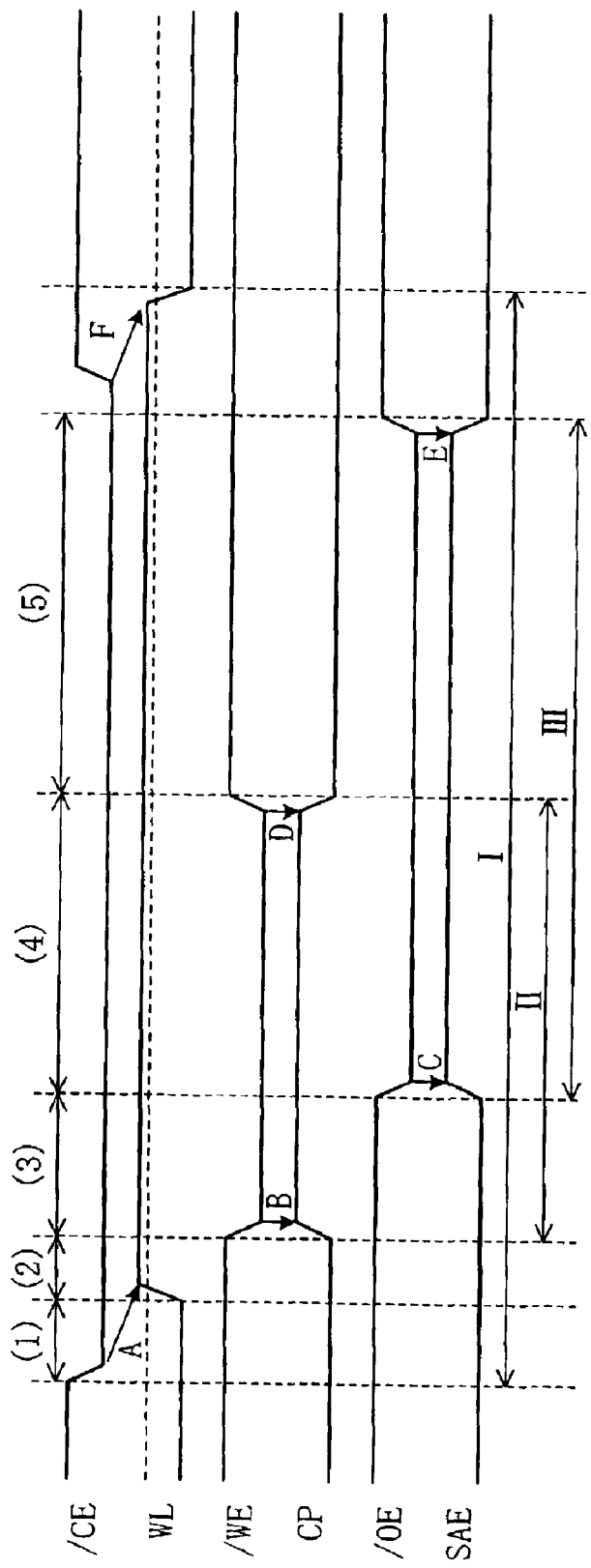
FIG. 5 illustrates data read operation timings of the ferroelectric memory in a power-off instruction time.

In the power-on state, data write time is shortened to prevent endurance deterioration of the ferroelectric memory 10. By contrast, in the power-off instruction time, the data write time is increased in order to obtain better data retention characteristics after power-off. That is, as will be understood from the comparison between FIG. 4 and FIG. 5, which illustrate the timings in a power-on state and the timings in a power-off instruction time, respectively, the timing in the power-off instruction time, depicted in FIG. 5, is such that each of the period (4) and the period (5) is set to be long. Specifically, although the fall timing of the signal /OE, indicated by reference character C, is unchanged, the period (pulse width) (4) is set longer by delaying the rise timing of the signal /WE, indicated by reference character D, in comparison with that shown in FIG. 4, and at the same time, the period (pulse width) (5) is set longer by delaying the rise timing of the signal /OE in comparison with that shown in FIG. 4. Thus, it is possible to increase the data write time to the ferroelectric memory 10 in the power-off instruction time.

Thus, in the present embodiment, the operation timing data for the power-on state and for the power-off instruction time of the ferroelectric memory 10 are stored beforehand in the ferroelectric memory 10, and these data are read out when power is turned on and then transferred to the latch circuit 11 in which the data are stored and retained. Consequently, in the power-on state, because the data write time is short, it is possible to prevent development of a ferroelectric fatigue deterioration phenomenon that is caused by excessive stress to the memory cells of the ferroelectric memory 10, and to improve device reliability. On the other hand, in the power-off instruction time in which a power-off instruction is input from the outside of the memory system, it is possible to improve data retention characteristics after power-off because the data write time is long.

In the power-off instruction time, the ferroelectric memory 10 carries out a refresh operation for all the memory cells. This contributes to enhancement of the speed of the sequence in the power-off instruction time since the number of memory cells that can be rewritten per cycle increases.

Moreover, even if signal racing occurs between the control signals input from the timing generating circuit 13 of the logic circuit 14, defects in operation timings of the ferroelectric memory 10 and the volatile memory 20 resulting from such signal racing are reliably prevented from occurring because the ferroelectric memory 10 and the volatile memory 20 incorporate the control circuits 9 and 19, respectively, and each of these control circuits 9 and 19 has a function of detecting the operation sequence of the corresponding memory.

In the present embodiment, the switching of operation timings in the ferroelectric memory 10 and the control of the change of operation timings between the ferroelectric memory 10 and the volatile memory 20 are performed in the system by providing the logic circuit 14 outside the ferroelectric memory 10, but it is of course also possible to configure these functions to be provided and carried out in the ferroelectric memory 10.

In addition, in the present embodiment, the logic circuit 14 includes the latch circuit 11 for retaining, during the power-on state, operation timing data concerning the data write time that are read out from the ferroelectric memory 10 when power is turned on, and the logic circuit 14 is arranged outside the ferroelectric memory 10. However, it is of course also possible to obtain similar effects even when these functions are provided within the ferroelectric memory 10.

Embodiment 2

Next, a memory system according to Embodiment 2 of the present invention is described below with reference to the drawings.

Figure 6:
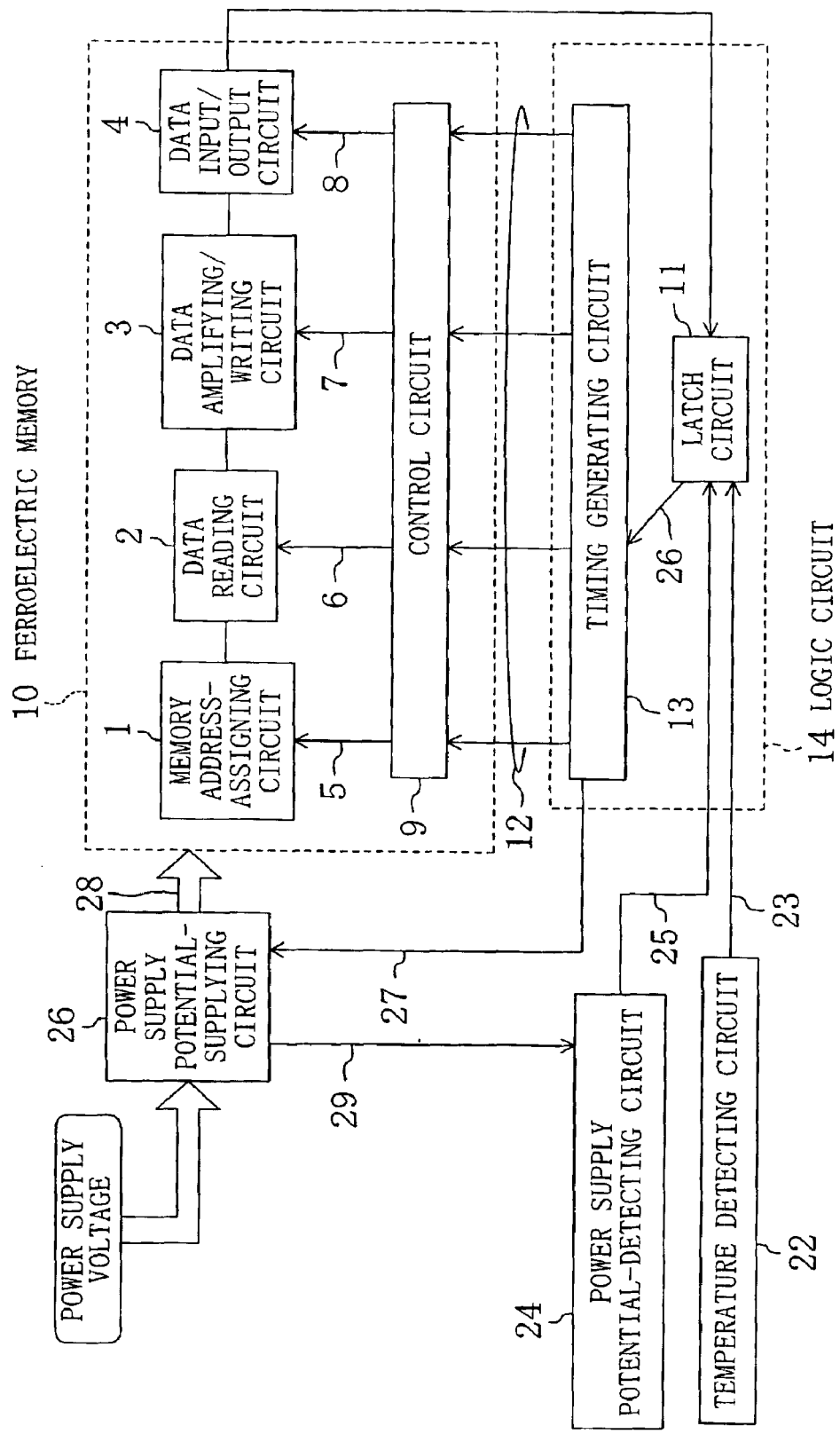
FIG. 6 shows the general configuration of a memory system according to Embodiment 2 of the present invention.

FIG. 6 schematically shows the configuration of a memory system according to Embodiment 2 of the present invention. The memory system shown in the figure has the ferroelectric memory 10 and the logic circuit 14 of the memory system shown in FIG. 1, but does not have the volatile memory 20.

The ferroelectric memory 10 receives power supply from a power supply potential-supplying circuit 26. The power supply potential-supplying circuit 26 is, in response to an external signal, supplied with a power supply potential from a power supply or cut off from the supply thereof, and while the power supply potential is being supplied, it adjusts the received power supply potential and supplies the adjusted power supply potential as a second power supply potential to devices in the memory system, which include the ferroelectric memory 10, via a power supply line 28.

Further, the memory system shown in FIG. 6 is provided with a power supply potential-detecting circuit 24 that detects the second power supply potential supplied from the power supply potential-supplying circuit 26, and a temperature detecting circuit 22 that detects the temperature (ambient temperature) of the memory system. The temperature detecting circuit 22 monitors, for example, variation in transistor characteristics due to temperature variation of the memory system to detect a temperature deviation from room temperature, and generates a timing data-selecting signal 23 that corresponds to the deviation. The power supply potential-supplying circuit 24 detects variations in the second power supply potential resulting from device operations in the memory system by monitoring deviations in voltage value from a reference potential or deviations in current value from a reference current to detect deviations in the second power supply potential from a reference power supply potential, and generates a timing data-selecting signal 25 that corresponds to the deviation. Both the selecting signal 23 from the temperature detecting circuit 22 and the selecting signal 25 from the power supply potential-detecting circuit 24 are output to the latch circuit 11 of the logic circuit 14.

Figure 7:
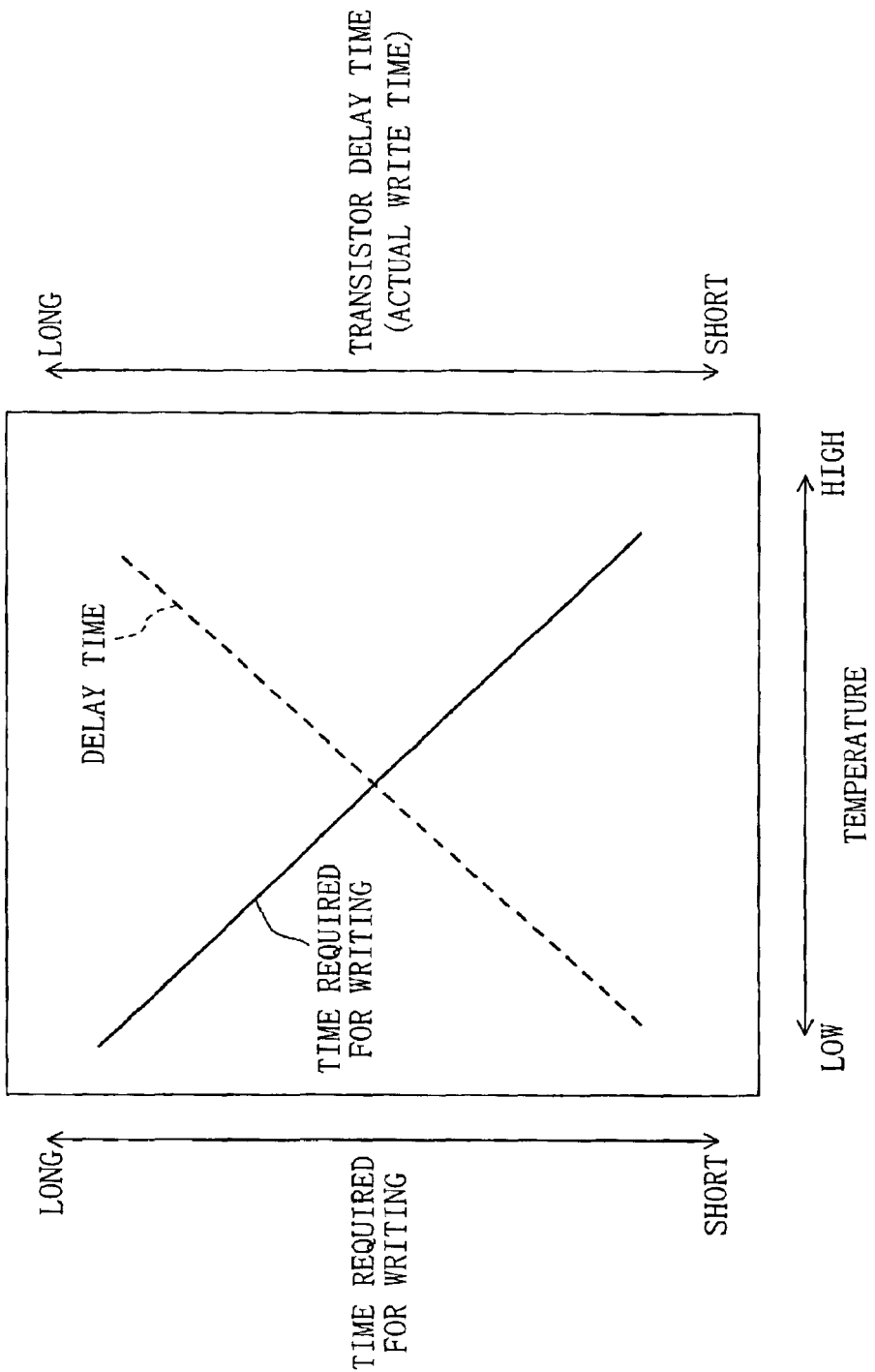
FIG. 7 shows a characteristic of time required for data writing to the ferroelectric memory with respect to system temperature.
Figure 8:
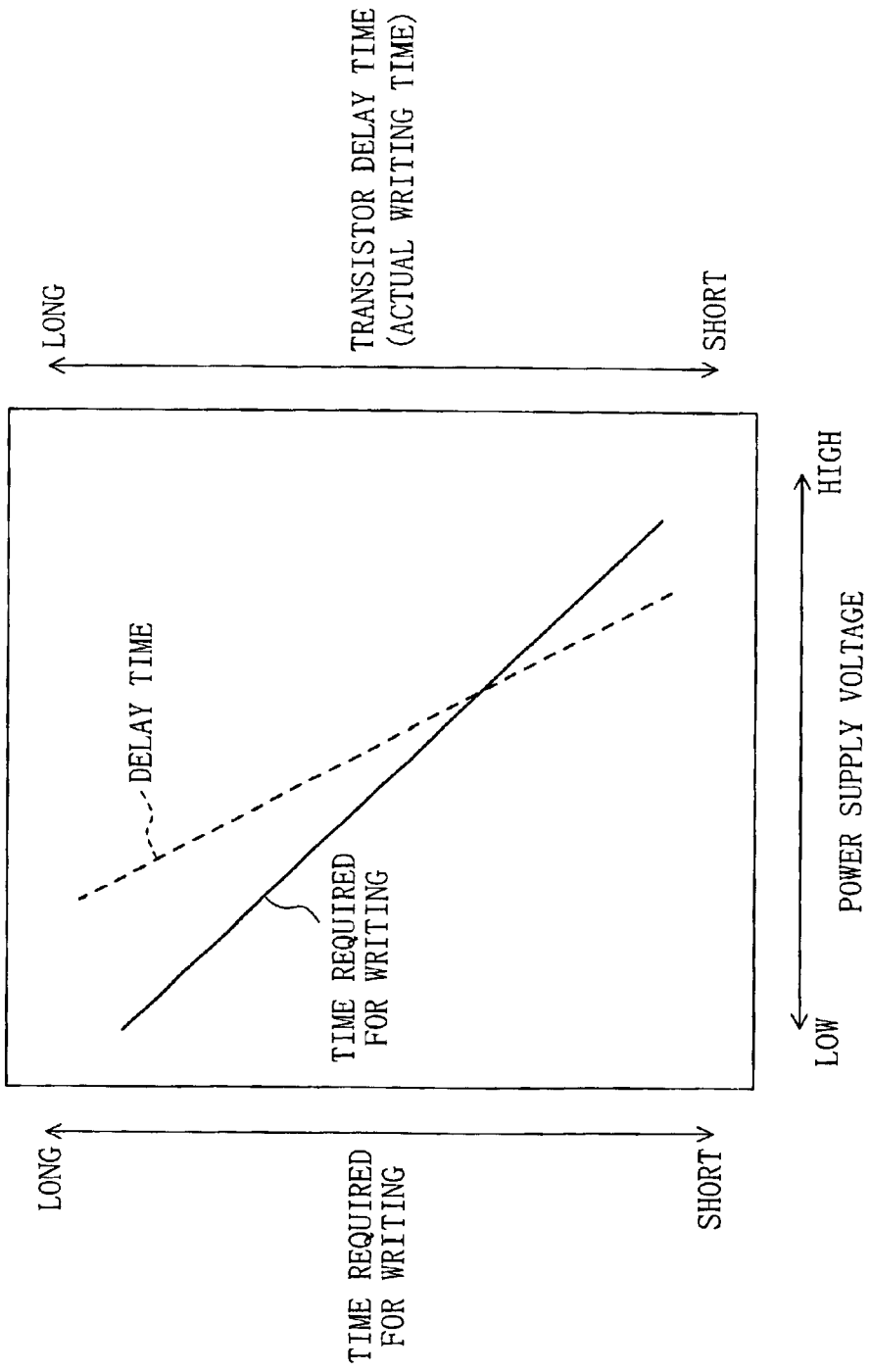
FIG. 8 shows a characteristic of time required for data writing to the ferroelectric memory with respect to a power supply potential.

The ferroelectric memory 10 stores in advance a characteristic of time required for data writing to the ferroelectric memory 10 with respect to temperature of the memory system, as shown in FIG. 7, and a characteristic of time required for data writing to the ferroelectric memory 10 with respect to the second power supply potential supplied from the power supply potential-supplying circuit 26, as shown in FIG. 8. Both of these characteristics are read by the control circuit 9 when power is turned on, and then they are stored and retained in the latch circuit 11. The characteristic of time required for data writing with respect to temperature, shown in FIG. 7, is set so that when the temperature is high, the time required for data writing is short, whereas when the temperature is low, the time required for data writing is long. Likewise, the characteristic of time required for data writing with respect to the second power supply potential, shown in FIG. 8, is set so that when the power supply potential is high, the time required for data writing is short, whereas when the power supply potential is low, the time required for data writing is long.

The latch circuit 11 of the logic circuit 14 receives the selecting signal 23 from the temperature detecting circuit 22, selects a time required for data writing that corresponds to the temperature of the memory system according to the characteristic shown in FIG. 7, and outputs it to the timing generating circuit 13. The latch circuit 11 also receives the selecting signal 25 from the power supply potential-detecting circuit 24, selects a time required for data writing that corresponds to the second power supply potential supplied to the memory system according to the characteristic shown in FIG. 8, and outputs it to the timing generating circuit 13.

Figure 9:
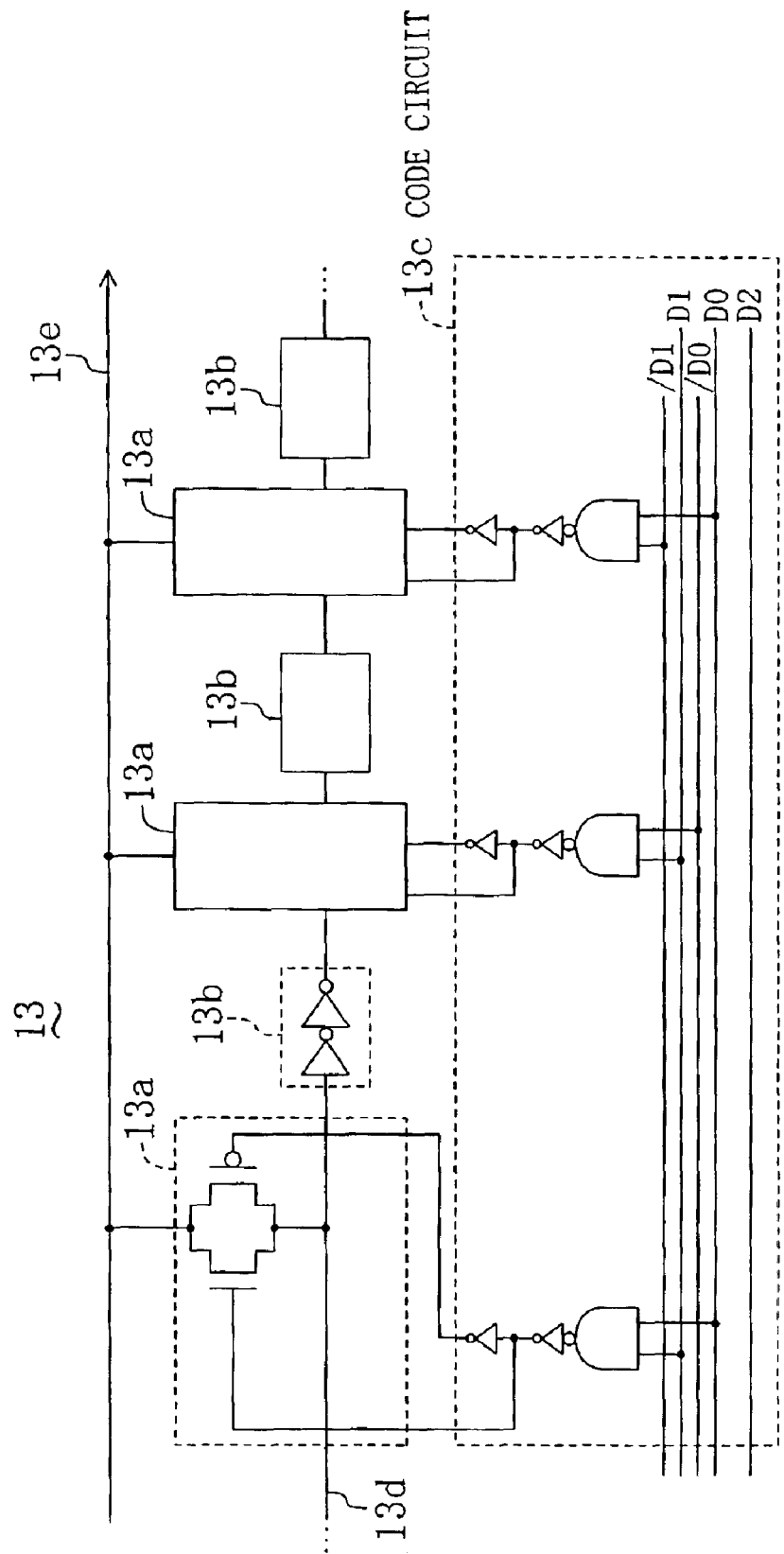
FIG. 9 shows the internal configuration of a timing generating circuit provided in the memory system.

In the timing generating circuit 13, the numbers of the selector switches 13a and the delay circuits 13b are restricted in order to reduce layout area. If, for example, because of this restriction, the timing generation corresponding to variation in the second power supply potential caused by device operations in the memory system and to variation in the system temperature cannot be achieved with the scale of the elements provided internally, timing data D0 and D1 are set to be (0, 1), as shown in FIG. 9, to switch the selector switch 13a that is positioned in the middle of FIG. 9 so that the input path 13d is connected to the output path 13e only through the delay circuit 13b that is positioned on the left side of the figure, and additionally, the control signal is set to be "1", for example. Further, the timing generating circuit 13 sets the control signal 27 supplied to the power supply potential-supplying circuit 26 to be "1" also in the power-off instruction time.

The power supply potential-supplying circuit 26 has a function of shifting the second power supply potential that is output to the power supply line 28 thereof to a higher level when it receives the control signal 27 that is "1" from the timing generating circuit 13.

Thus, in the present embodiment, when power is turned on, the characteristics of time required for data writing shown in FIGS. 7 and 8 are read out from the ferroelectric memory 10 and are then stored in the latch circuit 11.

Thereafter, according to temperature variation of the memory system, the temperature detecting circuit 22 outputs a selecting signal 23 corresponding to the temperature of the memory system to the latch circuit 11, and the latch circuit 11 selects a time required for data writing corresponding to the temperature of the memory system according to the characteristic shown in FIG. 7, and the timing generating circuit 13 controls data writing into the ferroelectric memory 10 via the control circuit 9 based on the selected time required for data writing. As a consequence, even when the memory system is in high temperatures, device reliability can be improved because excessive stress to the ferroelectric memory 10 is prevented and voltage application time is optimized by reducing the time required for data writing.

In addition, when the second power supply potential supplied from the power supply potential-supplying circuit 26 to the memory system varies, the power supply potential-detecting circuit 24 the variation and outputs the selecting signal 25 that corresponds to the varied power supply potential to the latch circuit 11. Based on the selecting signal 25, the latch circuit 11 selects a time required for data writing corresponding to the varied second power supply potential according to the characteristic shown in FIG. 8, and the timing generating circuit 13 controls data writing in the ferroelectric memory 10 via the control circuit 9 based on the selected time required for data writing. As a consequence, even when the second power supply potential supplied to the memory system varies, device reliability can be effectively improved because excessive stress to the ferroelectric memory 10 is prevented and voltage application time is optimized.

Further, even if the timing generating circuit 13 cannot set a timing corresponding to the time required for data writing because of restrictions in terms of the scale of the elements, although the latch circuit 11 outputs an appropriate time required for data writing according to variation in the system temperature or variation in the power supply potential, the timing generating circuit 13 outputs the control signal 27 that is "1" so that the power supply potential-supplying circuit 26 shifts the second power supply potential supplied to the power line 28 to a higher level. As a consequence, in the ferroelectric memory 10, good data writing can be performed with high power supply potentials even if a pulse width corresponding to a time required for data writing is not obtained.

Furthermore, according to the present embodiment, in the power-off instruction time, the timing generating circuit 13 outputs the control signal 27 that is "1" and the second power supply potential supplied from the power supply potential-supplying circuit 26 to the ferroelectric memory 10 is shifted to a higher level. This contributes to faster data writing and to improvement in data retention characteristics as well as to the setting of a long data write time in the power-off instruction time It should be noted that, although the temperature detecting circuit 22, the power supply potential-detecting circuit 24, and the power supply potential-supplying circuit 26 are arranged outside the ferroelectric memory 10 in the present embodiment, it is of course possible to provide these circuits within the ferroelectric memory 10.

The invention may be embodied in other forms without departing from the spirit or essential characteristics thereof The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A memory system comprising:

a non-volatile memory having a plurality of circuit blocks operated by inputting a first signal;

another memory having a plurality of circuit blocks operated by inputting a second signal;

a data latch circuit retaining at least one of output timings and cycles of the first signal and at least one of output timings and cycles of the second signal, wherein said at least one of output timings and cycles of the first signal is diffrent from said at least one of output timings and cycles of the second signal and at least one of output timings and cycles of the first and second signals are adjusted by a first and second variable delay circuit, respectively; and a timing generating circuit outputting the first signal to the non-volatile memory and outputting the second signal to the other memory according to at least one of the output timings and the cycles of the first signal and the second signal which are retained in the data latch circuit.

2. A memory system comprising:

a non-volatile memory having a plurality of circuit blocks operated by inputting a first signal;

another memory having a plurality of circuit blocks operated by inputting a second signal;

a data latch circuit retaining at least one of output timings and cycles of the first signal and at least one of output timings and cycles of the second signal; and a timing generating circuit outputting the first signal to the non-volatile memory and outputting the second signal to the other memory according to at least one of the output timings and the cycles of the first signal and the second signal which are retained in the data latch circuit, wherein:

the non-volatile memory stores the output timings and the cycles of the first signal and output timings and cycles of the second signal beforehand and comprises another timing generating circuit; and the other timing generating circuit transfers at least one of the output timings and the cycles of the first signal and at least one of the output timings and the cycles of the second signal stored in the non-volatile memory to the data latch circuit when power is turned on.

3. A semiconductor integrated circuit wherein the memory system according to claim 1 is incorporated on a single chip.

4. The memory system according to claim 1, wherein:

the non-volatile memory stores the output timings and the cycles of the first signal and output timings and cycles of the second signal beforehand and comprises another timing generating circuit; and the other timing generating circuit transfers at least one of the output timings and the cycles of the first signal and at least one of the output timings and the cycles of the second signal stored in the non-volatile memory to the data latch circuit when power is turned on.

5. A memory system comprising:

a non-volatile memory having a plurality of circuit blocks operated by inputting a first signal;

another memory having a plurality of circuit blocks operated by inputting a second signal;

a data latch circuit retaining at least one of output timings and cycles of the first signal and at least one of output timings and cycles or the second signal; and a timing generating circuit outputting the first signal to the non-volatile memory and outputting the second signal to the other memory according to at least one of the output tunings and the cycles of the first signal and the second signal which are retained in the data latch circuit, wherein the timing generating circuit comprises firs and second variable delay circuits for adjusting at least one of timings and cycles of the first and second signals respectively according to data retained in the data latch circuit.

* * * * *